(12) United States Patent
Pavio

(10) Patent No.: US 7,582,962 B1
(45) Date of Patent: Sep. 1, 2009

(54) HEAT DISSIPATION DEVICE

(75) Inventor: Jeanne S. Pavio, Paradise Valley, AZ (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 21 days.

(21) Appl. No.: 11/983,082

(22) Filed: Nov. 7, 2007

(51) Int. Cl.
*H01L 23/34* (2006.01)
(52) U.S. Cl. ............... 257/714; 257/705; 257/E33.075; 438/530; 438/540
(58) Field of Classification Search ................. 257/705, 257/707, 714, 721, 930, E33.075, E31.131; 361/382, 385; 438/530, 540
See application file for complete search history.

(56) References Cited

U.S. PATENT DOCUMENTS

| | | | | |
|---|---|---|---|---|
| 4,739,443 | A | * | 4/1988 | Singhdeo ..................... 361/689 |
| 5,870,823 | A | * | 2/1999 | Bezama et al. ................ 29/848 |
| 6,134,110 | A | * | 10/2000 | Langari ...................... 361/700 |
| 2005/0156780 | A1 | * | 7/2005 | Bonthron et al. ............ 342/107 |
| 2008/0118370 | A1 | * | 5/2008 | Zoulkarneev et al. ......... 417/50 |
| 2008/0239791 | A1 | * | 10/2008 | Tran ........................... 365/151 |

* cited by examiner

*Primary Examiner*—Phuc T Dang
(74) *Attorney, Agent, or Firm*—Daniel M. Barbieri

(57) ABSTRACT

A heat dissipation device comprises a multilayer substrate, a channel formed in the multilayer substrate, and tubes disposed within the channel, the tubes suitable for removing heat from a heat generating device located adjacent to the multilayer substrate.

19 Claims, 2 Drawing Sheets

US 7,582,962 B1

HEAT DISSIPATION DEVICE

TECHNICAL FIELD

The present invention generally relates to the field of heat dissipation devices, and more particularly to a heat dissipating device for a microchip.

BACKGROUND

Microchips comprise at least one integrated circuit. Microchips may be a dynamic random access memory chip, a microprocessor chip, a power amplifier chip, an application specific integrated circuit, a digital signal processor, and a programmable memory chip. Microchips generate heat. This heat must be removed from the chip or damage could be done to the chip, such as causing serious reliability, performance, and efficiency degradation. Currently, fans and fins are utilized for heat removal.

a power amplifier module, such as gallium nitride (GaN) devices, create significant heat. The heat must be removed immediately or the device will suffer serious reliability, performance, and efficiency degradation. For instance, for the best performance, reliability, and efficiency the recommended operating junction temperature of a GaN device is 150° C. Fans and fins may not be capable of removing enough heat to maintain a temperature of 150° C. or less.

SUMMARY

The disclosure is directed to a heat dissipation device.

The heat dissipation device may comprise a multilayer substrate, a channel formed in the multilayer substrate, and tubes disposed within the channel, the tubes suitable for removing heat from a heat generating device located adjacent to the multilayer substrate.

The heat dissipation device may comprise a multilayer substrate, a channel formed in the multilayer substrate, tubes disposed within the channel, and a diamond filled organic underfill. The multilayer substrate is located adjacent to a semiconductor and the diamond filled organic underfill is disposed within an area adjacent to a second side of the semiconductor opposite a first side adjacent to the multilayer substrate. The tubes and the diamond filled organic underfill are suitable for removing heat from the semiconductor.

It is to be understood that both the foregoing general description and the following detailed description are exemplary and explanatory only and are not necessarily restrictive of the claims. The accompanying drawings, which are incorporated in and constitute a part of the specification, illustrate examples and together with the general description, serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
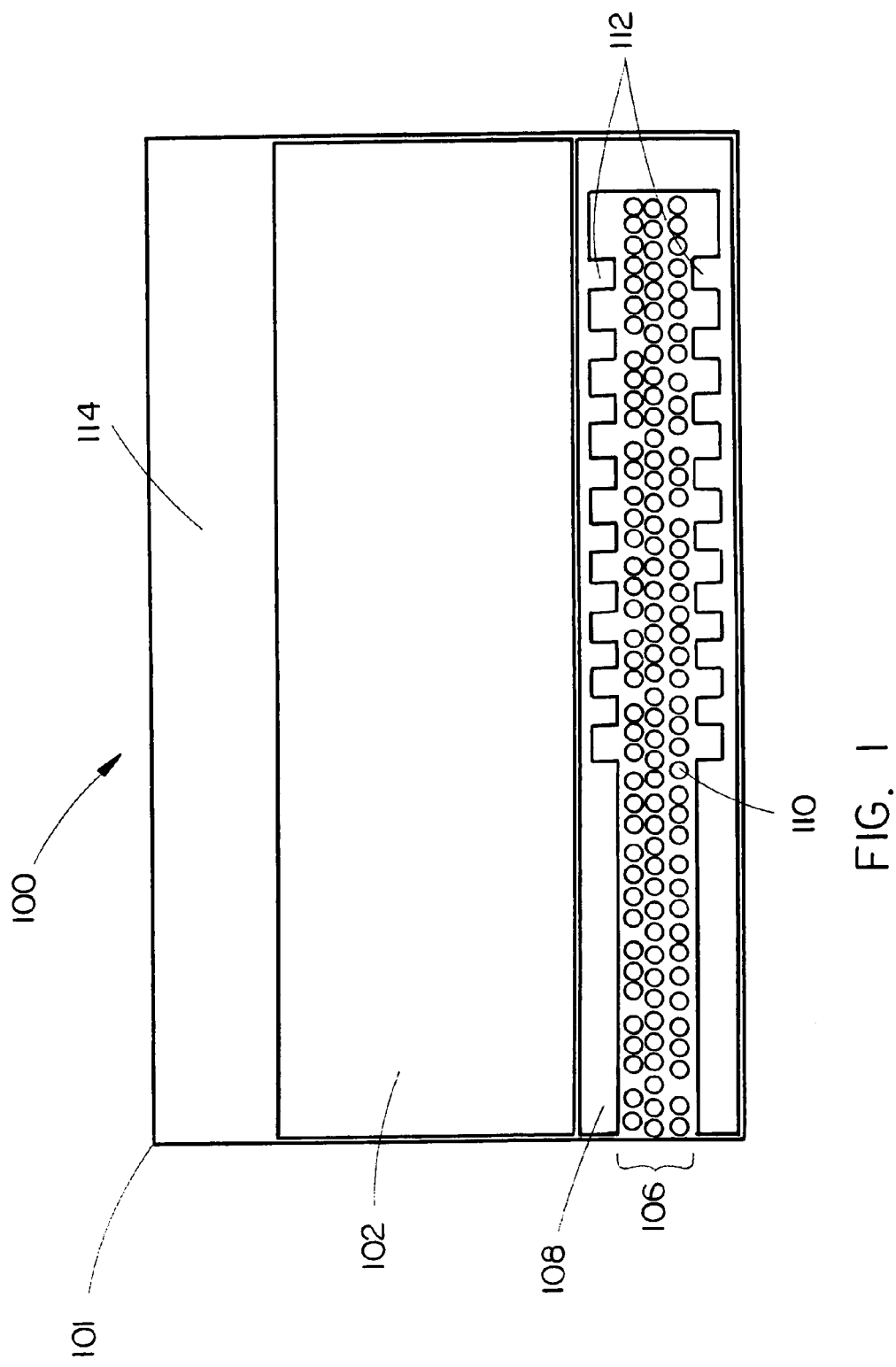
FIG. 1 is a cross-sectional view illustrating a heat dissipation device in a microchip.
Figure 2:
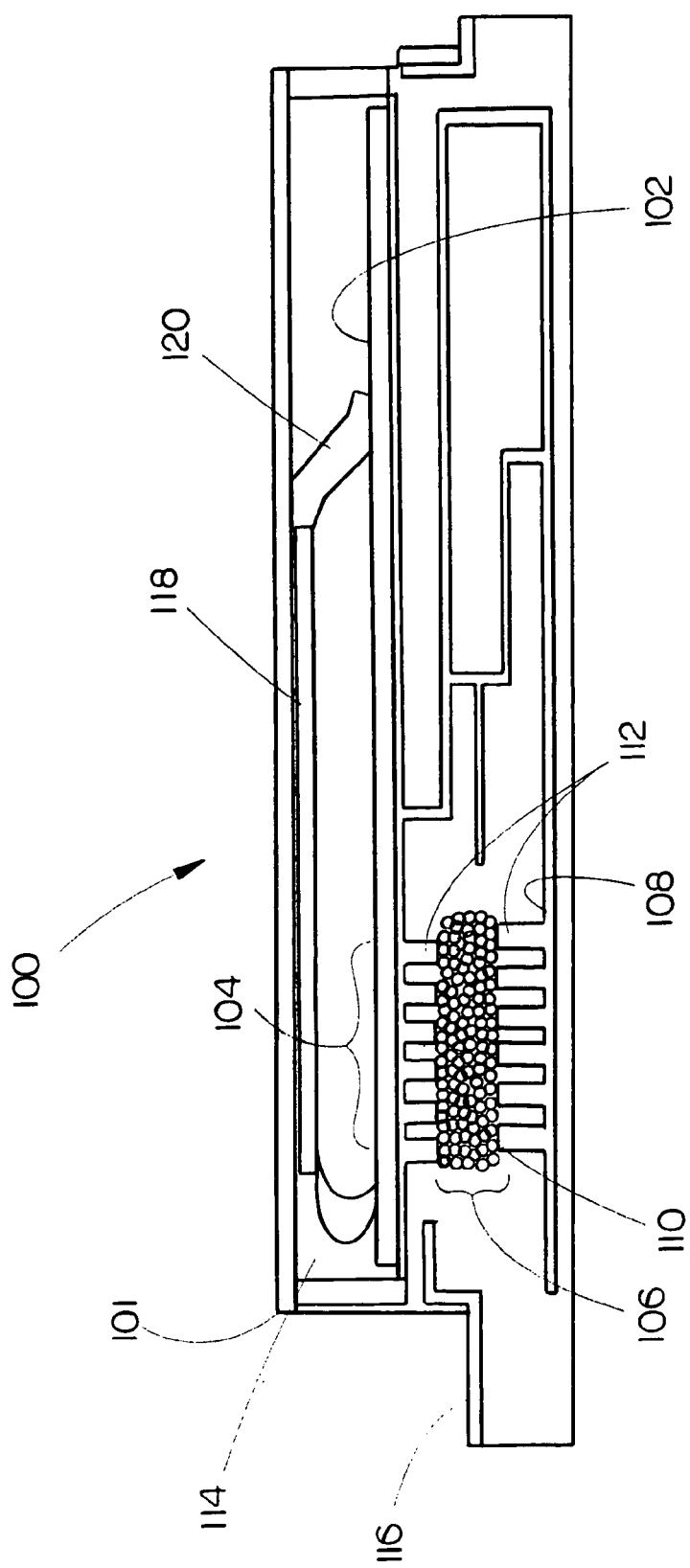
FIG. 2 is a cross-sectional view illustrating a heat dissipation device in a power amplifier module.

Referring to FIGS. 1 and 2 a cross-sectional view of a heat dissipation device 100 in a microchip 101 is shown. The heat dissipation device 100 is suitable for removing heat from a heat generating device 102. The heat dissipation device 100 may be utilized in a microchip 101 with a heat generating device 102. As used herein a "microchip" encompasses any device that has at least one integrated circuit. The microchip 101 may be a dynamic random access memory chip, a microprocessor chip, a power amplifier module, an application specific integrated circuit, a digital signal processor, and a programmable memory chip. This list is not restrictive. It is understood that any suitable microchip 101 that has a heat generating device 102 may be utilized without departing from the scope and intent of the disclosure.

The heat dissipation device 100 comprises a multilayer substrate 108, a channel 106 formed in a multilayer substrate 108, and tubes 110 disposed with the channel 106. The tubes 110 are suitable for removing heat from a heat generating device 102 located adjacent to the multilayer substrate 108. The heat dissipation device 100 may further comprise a diamond filled organic underfill 114. The heat dissipation device 100 may further comprise a thermal via 112 in the multilayer substrate 108. The heat dissipation device 100 may be utilized in a microchip 101 comprising a heat generating device 102. The microchip 101, such as power amplifier module, may further comprise at least one of, a microstrip transition 116, a launch numerical aperture and limiter die 118, and a flex circuit 120. This list is not restrictive. It is appreciated that other suitable components of a microchip may be utilized without departing from the scope and intent of the present invention.

The heat generating device 102 of the microchip 101 may comprise at least one of silicon, carbon, germanium, gallium nitride, ceramic, sapphire, or magnesium. In a power amplifier module, the heat generating device may be a gallium nitride (GaN) substrate, such as an integrated GaN on silicon die or an integrated GaN on magnesium die. This list is not restrictive. It is appreciated that other suitable heat generating devices 102 suitable for a microchip may be utilized without departing from the scope and intent of the disclosure. The heat generating device 102 may be a circuit, a semiconductor, or a power amplifier. This list is not restrictive. It is contemplated that other suitable heat generating devices 102 suitable for a microchip may be utilized without departing from the scope and intent of the disclosure.

The heat generating device 102 of a power amplifier module comprises a power amplified portion 104, as illustrated in FIG. 2. The power amplified portion 104, especially in the newest heat dissipation devices, such as gallium nitride (GaN) devices, create significant heat. The heat must be removed immediately or the device will suffer serious reliability and efficiency degradation. For example, the operating junction temperature of a GaN device has a maximum of 150° C.

The heat dissipation device 100 comprises a multilayer substrate 108 and a channel 106 formed in a multilayer substrate 108. The multilayer substrate 108 is located adjacent to the heat generating device 102, as illustrated in FIGS. 1 and 2. In a power amplifier module, the channel 106 formed in the multilayer substrate 108 is located adjacent to a power amplified portion 104 of the heat generating device 102 or semiconductor, as illustrated in FIG. 2.

The heat dissipation device 100 may comprise a plurality of channels 106. The multilayer substrate 108 may be a low temperature co-fired ceramic. The multilayer substrate 108 may be an organic board circuit or liquid crystal polymer circuit. This list is not restrictive. It is understood that any suitable multilayer substrate material for a power amplifier 100 may be utilized without departing from the scope and intent of the present invention.

The heat dissipation device 100 comprises tubes 110 disposed within the channel 106 of the multilayer substrate 108. The tubes 110 may be disposed within a plurality of channels 106. The tubes 110 may substantially occupy the channel 106 and/or channels 106 of the multilayer substrate 108.

The tubes 110 are suitable for removing heat from the heat generating device 102 of the microchip 101. The tubes 110 may be carbon nanotubes. The carbon nanotubes may be single walled carbon nanotubes and/or multi-walled carbon nanotubes. The tubes 110, such as the carbon nanotubes, are suitable for allowing a coolant to flow through the tubes 110. The coolant may flow through the tubes, such as the carbon nanotubes, by capillary action. The flowing of the coolant through the tubes 110 is suitable for removing heat from the heat generating device 102.

The coolant of the heat dissipation device 100 may be a heat transfer fluid, a refrigerant, and/or any suitable cooling medium for a heat dissipation device 100. The coolant may comprise air, water, Freon, oil, or water with additives, such as ethylene glycol, diethylene glycol, and/or propylene glycol. This list is not restrictive. It is understood that any suitable coolant for a heat dissipation device 100 utilized in a microchip 101 may be utilized without departing from the scope and intent of the present invention.

The heat dissipation device 100 may further comprise a diamond filled organic underfill 114. The diamond filled organic underfill 114 may be disposed within an area adjacent to a second side of the heat generating device 102 of the heat dissipation device 100 opposite a side of the heat generating device 102 adjacent to the multilayer substrate 108, as illustrated in FIGS. 1 and 2. The diamond filled organic underfill 114 may substantially occupy the area adjacent to the second side of the heat generating device 102 of the heat dissipation device 100. The diamond filled organic underfill 114 is suitable for removing heat from the heat generating device 102.

The multilayer substrate 108 may further comprise a thermal via 112. The multilayer substrate 108 may further comprise a plurality of thermal vias 112, as illustrated in FIGS. 1 and 2. The thermal vias 112 may be suitable for removing heat from the heat generating device 102.

The microchip 101, such as a power amplifier module, may further comprise a flex circuit 120, a launch numerical aperture (LNA) and a limiter die 118, and/or a microstrip transition 116, as illustrated in FIG. 2. The flex circuit 120 may be attached to the second side of the heat generating device 102, as illustrated in FIG. 2. The flex circuit 120 may have multiple attachments to the second side of the heat generating device 102. The flex circuit 120 may be an interconnected circuit. The microstrip transition 116 may have an electrical impedance of 50 ohms. This impedance is not restrictive. It is appreciated that any suitable impedance microstrip transition 116 for a microchip 101 may be utilized without departing from the scope and intent of the disclosure. The flex circuit 120, the launch numerical aperture (LNA) and a limiter die 118, and/or any other suitable component of a microchip 101 may occupy a portion of the area adjacent to a second side of the heat generating device 102 of the heat dissipation device 100 along with the diamond filled organic underfill 114 opposite the first side of the heat generating device 102 adjacent to the multilayer substrate 108.

The utilization of the tubes 110 and/or the coolant allows for heat removal from the heat generating device 102. This heat removal prevents reliability, performance, and efficiency degradation of the microchip 101 caused by overheating from heat produced by the heat generating device 102. The tubes and coolant may allow a heat dissipation device 100 comprising a heat generating device 102 comprising GaN to maintain an operating junction temperature of 150° C. or less. Furthermore, the utilization of a diamond filled organic underfill 114 allows for heat removal from the heat generating device 102. This heat removal helps to further prevent reliability and efficiency degradation of the microchip 101 caused by overheating in conjunction with the tubes 110 and/or the coolant. Additionally, a thermal via 112 may be utilized in conjunction with the tubes and/or coolant and/or the diamond filled organic underfill 114 to allow for further heat removal. This heat removal also helps to further prevent reliability and efficiency degradation of the microchip 101 caused by overheating.

It is believed that the present invention and many of its attendant advantages will be understood by the foregoing description, and it will be apparent that various changes may be made in the form, construction and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed is:

1. A heat dissipation device comprising:
   a multilayer substrate;
   a channel formed in the multilayer substrate;
   tubes disposed within the channel, the tubes suitable for removing heat from a heat generating device located adjacent to the multilayer substrate; and
   a diamond filled organic underfill, the diamond filled organic underfill disposed within an area adjacent to a second side of the heat generating device opposite a first side adjacent to the multilayer substrate, wherein the diamond filled organic underfill is suitable for removing heat from the heat generating device.

2. The heat dissipation device as claimed in claim 1, wherein the heat generating device is a semiconductor substrate.

3. The heat dissipation device as claimed in claim 2, wherein the heat dissipation device is utilized in a power amplifier module, and wherein the tubes are suitable for removing heat from a power amplified portion of the semiconductor.

4. The heat dissipation device as claimed in claim 1, wherein the heat generating device is at least one of silicon, carbon, germanium, gallium nitride, ceramic, sapphire, or magnesium.

5. The heat dissipation device as claimed in claim 1, wherein the tubes are carbon nanotubes.

6. The heat dissipation device as claimed in claim 1, wherein a coolant is disposed within the tubes.

7. The heat dissipation device as claimed in claim 6, wherein the coolant is selected from a group of air, water, Freon, oil, and water with an additive selected from at least one of ethylene glycol, diethylene glycol, and propylene glycol.

8. The heat dissipation device as claimed in claim 1, wherein the heat dissipation device is utilized in a microchip selected from a group of a dynamic random access memory chip, a microprocessor chip, a power amplifier module, an application specific integrated circuit, a digital signal processor, and a programmable memory chip.

9. The heat dissipation device as claimed in claim 1, wherein the multilayer substrate is selected from a group of a low temperature co-fired ceramic, an organic board circuit, or a liquid crystal polymer circuit.

10. The heat dissipation device as claimed in claim 1, wherein the multilayer substrate comprises a thermal via, wherein the thermal via is suitable for removing heat from the heat generating device.

11. A heat dissipation device comprising:
a multilayer substrate;
a channel formed in the multilayer substrate;
tubes disposed within the channel; and
a diamond filled organic underfill,
wherein the multilayer substrate is located adjacent to a semiconductor and the diamond filled organic underfill is disposed within an area adjacent to a second side of the semiconductor opposite a first side adjacent to the multilayer substrate,
wherein the tubes and the diamond filled organic underfill are suitable for removing heat from the semiconductor.

12. The heat dissipation device as claimed in claim 11, wherein the tubes are carbon nanotubes.

13. The heat dissipation device as claimed in claim 11, wherein a coolant is disposed within the tubes.

14. The heat dissipation device as claimed in claim 13, wherein the coolant is selected from a group air, water, Freon, oil, and water with an additive selected from at least one of ethylene glycol, diethylene glycol, and propylene glycol.

15. The heat dissipation device as claimed in claim 11, wherein the heat dissipation device is utilized in a microchip selected from a group of a dynamic random access memory chip, a microprocessor chip, a power amplifier module, an application specific integrated circuit, a digital signal processor, and a programmable memory chip.

16. The heat dissipation device as claimed in claim 11, wherein the heat dissipation device is utilized in a power amplifier module, and wherein the tubes and the diamond filled organic underfill are suitable for removing heat from a power amplified portion of the semiconductor.

17. The heat dissipation device as claimed in claim 11, wherein the semiconductor is at least one of silicon, carbon, germanium, gallium nitride, ceramic, sapphire, or magnesium.

18. The heat dissipation device as claimed in claim 11, wherein the multilayer substrate is selected from a group of a low temperature co-fired ceramic, an organic board circuit, and a liquid crystal circuit comprising a thermal via suitable for removing heat from the semiconductor substrate.

19. The heat dissipation device as claimed in claim 11, wherein the heat dissipation device maintains the semiconductor at a temperature below 150° C.

\* \* \* \* \*